United States Patent
Cheng et al.

(10) Patent No.: US 9,559,119 B2
(45) Date of Patent: *Jan. 31, 2017

(54) HIGH VOLTAGE METAL OXIDE SEMICONDUCTOR FIELD EFFECT TRANSISTOR INTEGRATED INTO EXTREMELY THIN SEMICONDUCTOR ON INSULATOR PROCESS

(71) Applicant: INTERNATIONAL BUSINESS MACHINES CORPORATION, Armonk, NY (US)

(72) Inventors: Kangguo Cheng, Schenectady, NY (US); Bruce B. Doris, Slingerlands, NY (US); Ali Khakifirooz, Los Altos, CA (US); Ghavam G. Shahidi, Pound Ridge, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 14/958,171

(22) Filed: Dec. 3, 2015

(65) Prior Publication Data

US 2016/0093638 A1 Mar. 31, 2016

Related U.S. Application Data

(63) Continuation of application No. 14/585,885, filed on Dec. 30, 2014, now Pat. No. 9,245,903.

(Continued)

(51) Int. Cl.
*H01L 27/00* (2006.01)
*H01L 27/12* (2006.01)
(Continued)

(52) U.S. Cl.
CPC ..... *H01L 27/1203* (2013.01); *H01L 21/26513* (2013.01); *H01L 21/7624* (2013.01);
(Continued)

(58) Field of Classification Search
CPC ............. H01L 27/0688; H01L 27/1203; H01L 27/1207; H01L 21/84; H01L 29/42384
See application file for complete search history.

(56) References Cited

U.S. PATENT DOCUMENTS 8,299,561 B2 10/2012 Botula et al.
8,324,684 B1 12/2012 Pernyeszi
(Continued)

OTHER PUBLICATIONS

List of IBM Patents or Patent Applications Treated as Related.

*Primary Examiner* — Ngan Ngo
(74) *Attorney, Agent, or Firm* — Tutunjian & Bitetto, P.C.; Vazken Alexanian

(57) ABSTRACT

An electrical device including a first semiconductor device in a first region of the SOI substrate and a second semiconductor device is present in a second region of the SOI substrate. The first semiconductor device comprises a first source and drain region that is present in the SOI layer of the SOI substrate, raised source and drain regions on the first source and drain regions, and a first gate structure on a channel region portion of the SOI layer. The second semiconductor device comprises a second source and drain region present in a base semiconductor layer of the SOI substrate and a second gate structure, wherein a gate dielectric of the second gate structure is provided by a buried dielectric layer of the SOI substrate and a gate conductor of the second gate structure comprises a same material as the raised source and drain region.

19 Claims, 8 Drawing Sheets

Related U.S. Application Data

(60) Provisional application No. 61/978,469, filed on Apr. 11, 2014.

(51) Int. Cl.

| | | |
|---|---|---|
| *H01L 21/84* | (2006.01) | |
| *H01L 21/762* | (2006.01) | |
| *H01L 21/265* | (2006.01) | |
| *H01L 29/10* | (2006.01) | |
| *H01L 29/06* | (2006.01) | |
| *H01L 27/06* | (2006.01) | |
| *H01L 29/423* | (2006.01) | |
| *H01L 29/417* | (2006.01) | |
| *H01L 29/49* | (2006.01) | |
| *H01L 21/8234* | (2006.01) | |

(52) U.S. Cl.
CPC ........ *H01L 21/76224* (2013.01); *H01L 21/84* (2013.01); *H01L 27/0688* (2013.01); *H01L 27/1207* (2013.01); *H01L 29/0649* (2013.01); *H01L 29/1083* (2013.01); *H01L 29/41783* (2013.01); *H01L 29/42384* (2013.01); *H01L 29/495* (2013.01); *H01L 21/823418* (2013.01); *H01L 21/823437* (2013.01); *H01L 29/0653* (2013.01)

(56) References Cited

U.S. PATENT DOCUMENTS

| | | |
|---|---|---|
| 8,431,994 B2 | 4/2013 | Chan et al. |
| 8,492,854 B1 | 7/2013 | Cheng et al. |
| 8,507,989 B2 | 8/2013 | Khakifirooz et al. |
| 9,245,903 B2 * | 1/2016 | Cheng ................ H01L 27/1203 |
| 2006/0170047 A1 | 8/2006 | Ishimaru |

* cited by examiner

HIGH VOLTAGE METAL OXIDE SEMICONDUCTOR FIELD EFFECT TRANSISTOR INTEGRATED INTO EXTREMELY THIN SEMICONDUCTOR ON INSULATOR PROCESS

BACKGROUND

Technical Field

The present disclosure relates generally to semiconductor fabrication, and more particularly to structures and methods for forming semiconductor devices on semiconductor on insulator (SOI) substrates.

Description of the Related Art

With the continuing trend towards miniaturization of integrated circuits (ICs), there is a need for transistors to have higher drive currents with increasingly smaller dimensions. In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties.

SUMMARY

In one embodiment, a method of forming semiconductor devices is provided that includes forming isolation regions through the semiconductor on insulator (SOI) layer of a semiconductor on insulator (SOI) substrate to define a first device region and a second device region in the SOI substrate. A first semiconductor device is formed in the first device region, wherein the first semiconductor device includes a first source region and a first drain region that is formed in the SOI layer of the SOI substrate, raised source and drain regions on the first source and drain regions in the SOI layer, and a first gate structure on a channel region portion of the SOI layer in the first device region. A second semiconductor device is formed in the second device region, wherein the second device includes a second source region and a second drain region that is present in a base semiconductor substrate of the SOI substrate, and a second gate structure including a gate dielectric provided by a buried dielectric layer of the SOI substrate and a gate conductor comprised of a same material as the raised source and drain regions.

In another aspect, an electrical device is provided that includes a semiconductor on insulator (SOI) substrate, wherein a first semiconductor device is present in a first device region of the SOI substrate and a second semiconductor device is present in a second device region of the SOI substrate. The first semiconductor device comprises a first source region and a first drain region that is present in the SOI layer of the SOI substrate in the first device region of the SOI substrate, raised source and drain regions on the first source region and the first drain region, and a first gate structure on a channel region portion of the SOI layer in the first device region. The second semiconductor device comprises a second source region and a second drain region present in a base semiconductor layer of the SOI substrate and a second gate structure, wherein a gate dielectric of the second gate structure is provided by a buried dielectric layer of the SOI substrate between the SOI layer and the base semiconductor substrate, and a gate conductor of the second gate structure comprises a same material as the raised source region and the raised drain region.

In another embodiment, an electrical device is provided that includes a semiconductor on insulator (SOI) substrate, wherein a low voltage semiconductor device is present in a first device region of the SOI substrate and a high voltage semiconductor device is present in a second device region of the SOI substrate. The low voltage semiconductor device comprises a first source region and a first drain region that is present in the SOI layer of the SOI substrate in the first device region of the SOI substrate, raised source and drain regions on the first source region and the first drain region, and a first gate structure on a channel region portion of the SOI layer in the first device region. The high voltage semiconductor device comprises a second source region and a second drain region present in a base semiconductor layer of the SOI substrate and a second gate structure, wherein a gate dielectric of the second gate structure is provided by a buried dielectric layer of the SOI substrate between the SOI layer and the base semiconductor substrate and a gate conductor of the second gate structure comprises a same material as the raised source region and the raised drain region.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
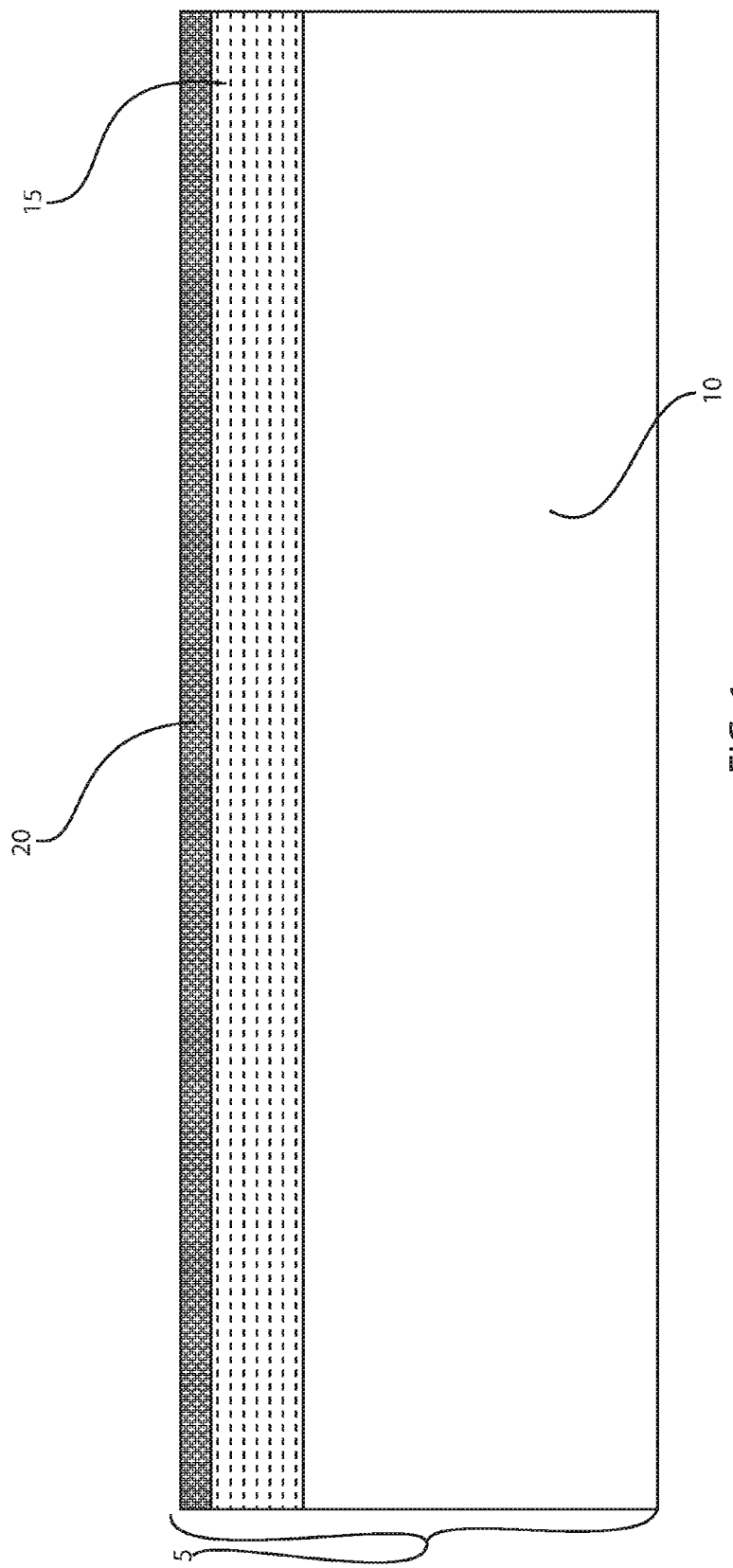
FIG. 1 is a side cross-sectional view of a semiconductor on insulator (SOI) substrate, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein combine ultra thin body on box (UTBB) logic semiconductor devices and high voltage semiconductor devices simultaneously on the same semiconductor on insulator (SOI) substrate, such as an extremely thin semiconductor on insulator (ETSOI) substrate.

An extremely thin semiconductor on insulator (ETSOI) substrate is an SOI substrate, in which the upper semiconductor layer (also referred to as semiconductor on insulator (SOI) layer) that is present atop the buried dielectric layer of the SOI substrate has a thickness of 10 nm or less. The SOI layer of an ETSOI substrate may be referred to as an ETSOI layer. As used herein, "semiconductor device" refers to an intrinsic semiconductor material that has been doped, that is, into which a doping agent has been introduced, giving it different electrical properties than the intrinsic semiconductor. In some embodiments, the semiconductor devices are field effect transistors (FETs). A field effect transistor (FET) is a transistor in which output current, i.e., source-drain current, is controlled by the voltage applied to the gate. A field effect transistor typically has three terminals, i.e., gate, source and drain.

In some embodiments, the UTBB semiconductor device that is formed on the SOI substrate, e.g., ETSOI substrate, is a FET that is a low voltage metal oxide semiconductor field effect transistor MOSFET, in which the channel of the MOSFET is positioned within the SOI layer, e.g., ETSOI layer, of the SOI substrate 5. As used herein, the term "low voltage" as used to describe a semiconductor device denotes an operating voltage for the device typically ranging from 0.5 volts to 1.5 volts. As used herein, the term "high voltage" as used to describe a semiconductor device denotes an operating voltage for the device typically ranging from 5 volts to 25 volts. The high voltage semiconductor devices that are present simultaneously with the low voltage UTBB logic semiconductor devices may be FETs, in which the source and drain region of the device is provided in the base semiconductor substrate that is underlying the buried dielectric layer of the SOI substrate, e.g., ETSOI substrate. The gate structure of the high voltage semiconductor devices may employ the buried dielectric layer of the SOI substrate as the gate dielectric. Further details of the methods and structures of the present disclosure are now discussed with greater detail with reference to FIGS. 1-8.

FIG. 1 depicts one embodiment of an SOI substrate 5, as used in accordance with the disclosed methods and structures. In one embodiment, the SOI substrate 5 comprises at least a first semiconductor layer 20 (hereafter referred to as an ETSOI layer 20) overlying a buried dielectric layer 15, wherein the ETSOI layer 20 has a thickness of less than 10 nm. A second semiconductor layer 10 (hereafter referred to as base semiconductor substrate 10) may be present underlying the buried dielectric layer 15.

The ETSOI layer 20 may comprise any semiconducting material including, but not limited to Si, strained Si, SiC, SiGe, SiGeC, Si alloys, Ge, Ge alloys, GaAs, InAs, and InP, or any combination thereof. The ETSOI layer 20 may be thinned to a desired thickness by planarization, grinding, wet etch, dry etch, oxidation followed by oxide etch, or any combination thereof. One method of thinning the ETSOI layer 20 is to oxidize the Si by a thermal dry or wet oxidation process, and then wet etch the oxide layer using a hydrofluoric acid mixture. This process can be repeated to achieve the desired thickness. In one embodiment, the ETSOI layer 20 has a thickness ranging from 1.0 nm to 10.0 nm. In another embodiment, the ETSOI layer 20 has a thickness ranging from 1.0 nm to 5.0 nm. In a further embodiment, the ETSOI layer 20 has a thickness ranging from 3.0 nm to 8.0 nm. The base semiconductor substrate 10 may be a semiconducting material including, but not limited to Si, strained Si, SiC, SiGe, SiGeC, Si alloys, Ge, Ge alloys, GaAs, InAs, InP as well as other III/V and II/VI compound semiconductors.

The buried dielectric layer 15 that may be present underlying the ETSOI layer 20 and atop the base semiconductor substrate 10 may be formed by implanting a high-energy dopant into the SOI substrate 5 and then annealing the structure to form a buried insulating layer, i.e., buried dielectric layer 15. In another embodiment, the buried dielectric layer 15 may be deposited or grown prior to the formation of the ETSOI layer 20. In yet another embodiment, the SOI substrate 5 may be formed using wafer-bonding techniques.

Figure 2:
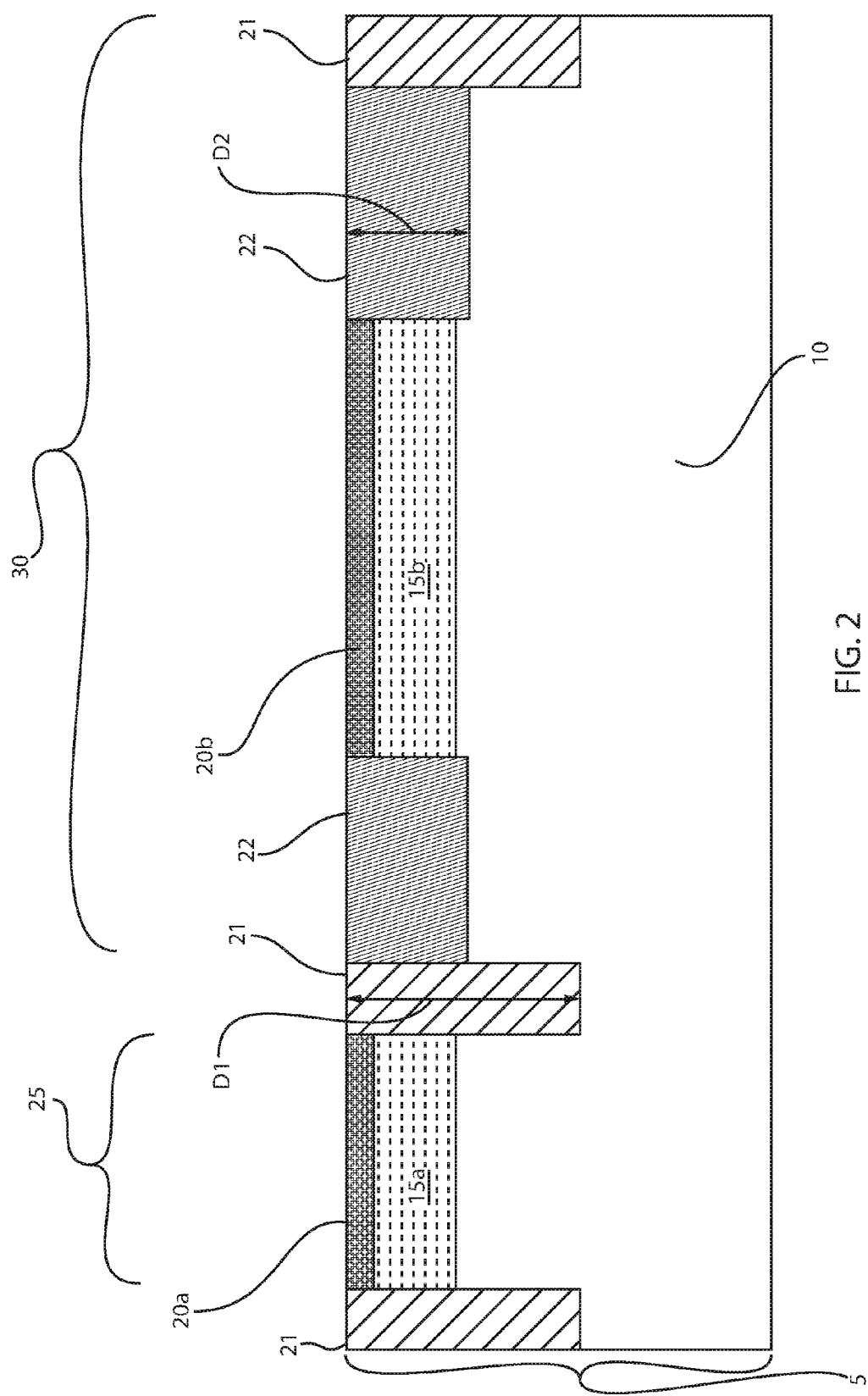
FIG. 2 is a side cross-sectional view of forming isolation regions in the SOI substrate to define a first and a second device region, in accordance with one embodiment of the present disclosure.

FIG. 2 depicts one embodiment of forming isolation regions 21, 22 into the SOI substrate 5 to define a first device region 25 and a second device region 30. In some embodiments, deep trench isolation regions 21 are positioned to define a first device region 25 for containing a first semiconductor device, such as a UTBB low voltage FET, and a second device region 30 for containing a second semiconductor device, such as a high voltage FET. The semiconductor device that is formed in the first device region may be referred to as a first semiconductor device, and the semiconductor device that is formed in the second device region may be referred to as a second semiconductor device. In some embodiments, further isolation between the first device region 25 and the second device region 30 can be provided by doped well regions (not shown) in the substrate 5 which are counter doped relative to the semiconductor devices that are present in the first device region 25 and the second device region 30. For example, when the first semiconductor device that is present in the first device region 25 is a p-type semiconductor device, the isolation may be provided by an underlying n-type well (not shown), and when the second semiconductor device in the second device region 30 is an n-type semiconductor device, the isolation may be provided by an underlying p-type well (not shown).

The deep trench isolation regions 21 are trench isolation regions having a depth D1 greater than 50 nm, typically being greater than 100 nm. In one example, the depth D1 of the deep trench isolation regions 21 is equal to 200 nm. It is noted that the above noted depths are provided for illustrative purposes only, and are not intended to limit the present disclosure. For example, any depth is suitable for the deep trench isolation regions so long as the depth extends into the base semiconductor substrate 10 and is suitable for providing electrical isolation between the first device region 25 and the second device region 30.

Forming the deep trench isolation regions 21 may include deposition, photolithography and etch processes. In one example, a photolithographic mask (not shown) is produced, by applying a photoresist layer (not shown) on the SOI layer 20, e.g., ETSOI layer. The photoresist layer is then patterned utilizing lithography so as to expose selective regions of the SOI substrate 5 in which trenches are to be formed. The pattern is then transferred into the SOI substrate 5 using an etching process, such as an anisotropic etch process. As used herein, an "anisotropic etch process" denotes a material removal process in which the etch rate in the direction normal to the surface to be etched is higher than in the direction parallel to the surface to be etched. Dry anisotropic etching processes suitable for forming the trench include, but are not limited to, reactive ion etch, ion-beam etching, plasma etching or a combination thereof.

The trenches for the deep trench isolation regions 21 may have a width W1 that ranges from 30 nm to 250 nm. In another embodiment, trenches for the deep trench isolation regions 21 have a width W1 that ranges from 50 nm to 200 nm. The aspect ratio (height to width ratio) of the trench for the deep trench isolation regions 21 may range from 2:1 to 10:1. In one example, the aspect ratio of the trench for the deep trench isolation regions 21 is 5:1.

In a following process step, the trench for the deep trench isolation regions 21 may be filled with a dielectric material. For example, the dielectric material for filling the trench of the deep trench isolation regions 21 may be an oxide material, such as silicon oxide, a nitride material, such as silicon nitride, or an oxynitride material, such as silicon oxynitride. The dielectric material that is deposited in the trench for the deep trench isolation regions 21 may be deposited using a chemical vapor deposition (CVD) process, such as metal organic chemical vapor deposition, plasma enhanced chemical vapor deposition, high density plasma chemical vapor deposition or combinations thereof.

In some embodiments, following the formation of the deep trench isolation regions 21, shallow trench isolation (STI) regions 22 may be formed in the second device region 25. The positioning of the shallow trench isolation regions 22 may dictate the width of the gate dielectric for the gate structure of the semiconductor device that is present in the second device region, e.g., high voltage FET. In the second device region 30, the remaining portion of the buried dielectric layer 15b provides the gate dielectric for the gate structure of the semiconductor device, e.g., high voltage FET, that is present in the second device region 30. In some embodiments, the shallow trench isolation regions 22 may be in direct contact with the deep trench isolation regions 21.

The shallow trench isolation region 22 are formed using a process sequence that is similar to the process sequence described above for forming the deep trench isolation regions 21, with the exception that the depth D2 of the shallow trench isolation region 22 is less than the depth of the deep trench isolation region 21. For example, the depth D2 of the shallow trench isolation region 22 may range from 10 nm to 20 nm. It is noted that this example is provided for illustrative purposes only, and is not intended to limit the present disclosure. The shallow trench isolation 22 region may have any depth D2 so long as shallow trench isolation region 22 extends through the SOI layer 20, e.g., ETSOI layer.

Following the formation of the isolation regions 21, 22, the remaining portion of the SOI layer 20a that is present in the first device region 25 provides the location for the channel and source and drain regions of the first semiconductor device, e.g., UTBB low voltage FET, that is present in the first device region 25, and the remaining portion of the SOI layer 20b that are present in the second device region 30 provides a portion of the gate structure for the second semiconductor device, e.g., high voltage FET, that is present in the second device region 30. Following the formation of the isolation regions 21, 22, the remaining portion of the buried dielectric layer 15b that is present in the second device region 20, provides the gate dielectric for the gate structure for the second semiconductor device, e.g., high voltage semiconductor device, that is present in the second device region 20.

Figure 3:
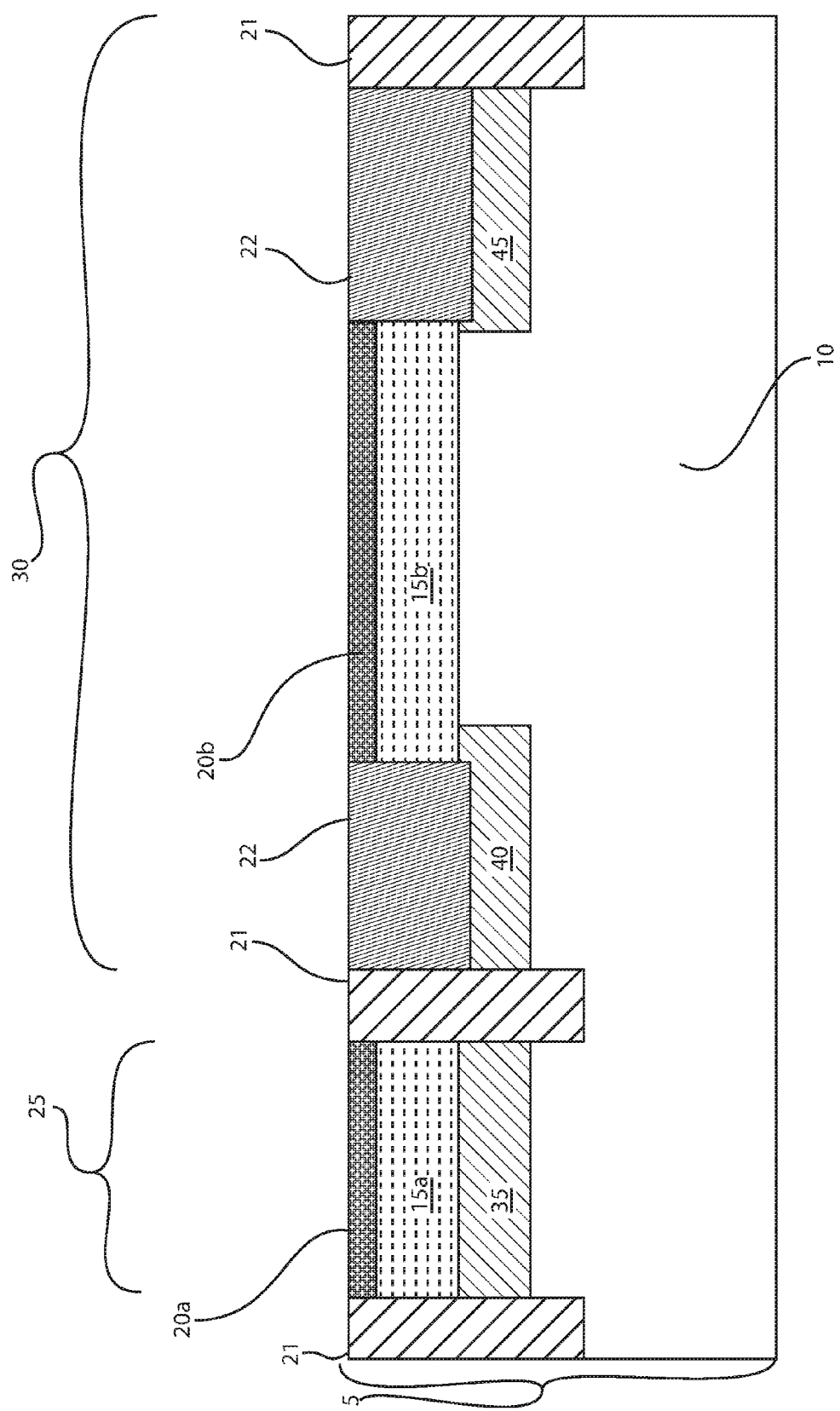
FIG. 3 is a side cross-sectional view depicting one embodiment of forming well regions in the first and second device regions of the SOI substrate, in accordance with one embodiment of the present disclosure.

FIG. 3 depicts one embodiment of forming well regions 35, 40, 45 in the first and second device regions 25, 30 of the SOI substrate 5. The well region 35 that is formed in the first device region 25 is typically positioned within a portion of the base semiconductor substrate 10 so that the well region 35 is in contact with a back surface portion of the buried dielectric layer 15a. In this embodiment, the first well region 35 provides the gate conductor of a back gate structure to the first semiconductor device, e.g., UTBB low voltage FET, that is formed in the first device region 25, wherein the channel of the first semiconductor device is present in the SOI layer 10a, e.g., ETSOI layer. The second and third well regions 40, 45 that are present in the second device region 30 are source and drain regions for the second semiconductor device, e.g., high voltage FET, that is present in the second device region 30. As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel.

Typically, the first, second and third well regions 35, 40, 45 are simultaneously formed in the base semiconductor substrate 10 of the SOI substrate 5 using ion implantation of n-type or p-type dopants. Ion implantation is a process by which ions of a material are accelerated in an electrical field and impacted into a solid. By simultaneously formed it is meant that the first, second and third well regions 35, 40, 45 are formed using a same ion implantation, i.e., single ion implantation, for the first, second and third well regions 35, 40, 45 using a same conductivity type dopant, e.g., n-type or p-type dopant. For example, because the first, second and third well regions 35, 40, 45 are formed using a simultaneous ion implantation having a same dopant conductivity, dopant dose and implant power, each of the first, second and third well regions 35, 40, 45 will be present at the same depth in the base semiconductor substrate 10 of the SOI substrate, and will have the same concentration of dopant, e.g., p-type or n-type dopant. This is distinguishable from using a separate ion implantation for each of the first, second and third well regions 35, 40, 45, because using a separate ion implantation step for each of the first, second and third well regions 35, 40, 45 would require separate photolithography masks and lithography steps to define the location of the first well region 35 and the second and third well regions 40 and 45 and results in higher fabrication cost.

In some embodiments, the conductivity type of the second and third well regions 40, 45 is selected to provide the conductivity type of the second semiconductor device that is present in the second device region 30. For example, doping the second and third well regions 40, 45 with a p-type dopant provides a p-type second semiconductor device, e.g., p-type high voltage field effect transistor (pFET), and doping the second and third well regions 40, 45 with an n-type dopant provides an n-type second semiconductor device, e.g., n-type high voltage field effect transistor (nFET). As used herein, "p-type" refers to the addition of impurities to an intrinsic semiconductor that creates deficiencies of valence electrons. In a type IV semiconductor, such as silicon (Si), examples of p-type dopants, i.e., impurities, include but are not limited to: boron, aluminum, gallium and indium. As used herein, "n-type" refers to the addition of impurities that contributes free electrons to an intrinsic semiconductor. In a type IV semiconductor, such as silicon (Si), examples of n-type dopants, i.e., impurities, include but are not limited to antimony, arsenic and phosphorous.

As indicated above, the first, second and third well regions 35, 40, 45 typically have the same concentration of p-type or n-type dopant. For example, the dopant concentration in each of the first, second and third well regions 35, 40, 45 may range from $10^{17}$ atoms/cm$^3$ to $10^{19}$ atoms/cm$^3$. In another example, the dopant concentration in each of the first, second and third well regions 35, 40, 45 may range from $5 \times 10^{17}$ atoms/cm$^3$ to $5 \times 10^{18}$ atoms/cm$^3$. Because the first, second and third well regions 35, 40, 45 are formed using the same ion implantation step, the region having the highest concentration of dopant for each of the first, second and third well regions 35, 40, 45 is present at the same depth of the base semiconductor substrate 10. For example, the depth D3 of the highest concentration of dopant for each of the first, second and third well region 35, 40, 45 may range from 20 nm to 100 nm, as measured from the upper surface of the base semiconductor substrate 10. In another embodiment, the depth D3 of the highest concentration of dopant for each of the first, second and third well region 35, 40, 45 may range from 30 nm to 50 nm, as measured from the upper surface of the base semiconductor substrate 10.

Figure 4:
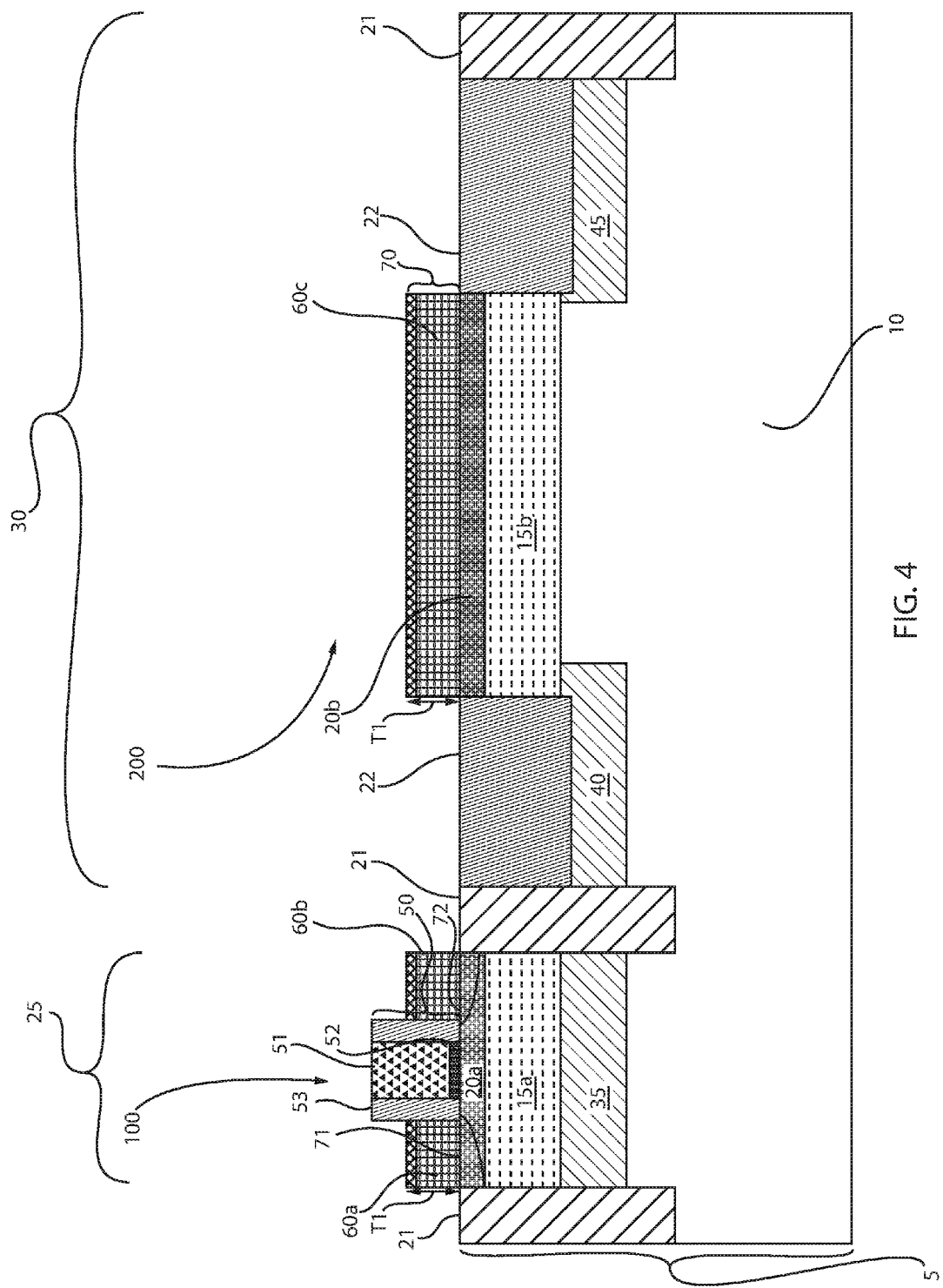
FIG. 4 is a side cross-sectional view depicting one embodiment of forming the gate structure and source and drain regions of a first semiconductor device, such as a low voltage semiconductor device, in a first device region of the SOI substrate, and forming the gate conductor of the gate structure to a second semiconductor device, such as a high voltage semiconductor device, in the second device region of the SOI substrate, in accordance with the present disclosure.

FIG. 4 depicting one embodiment of forming a gate structure 50 (hereafter referred to as first gate structure 50) and raised source and drain regions 60a, 60b of a first semiconductor device 100, such as a UTBB low voltage FET, in a first device region 25 of the SOI substrate 5, and forming the gate conductor 60c of the gate structure 70 to a second semiconductor device 200, such as a high voltage FET, in the second device region 30 of the SOI substrate 5. A "gate structure" is a structure used to control output current (i.e., flow of carriers in the channel) of a semiconducting device through electrical fields.

The first gate structure 50 can be formed using deposition, photolithography and a selective etching process. For example of stack of material layers for the first gate structure 50 are first formed on at least the SOI layer 20a of the SOI substrate 5 in the first device region 25. Following formation, the stack of material layers are patterned and etched to form the first gate structure 50. Specifically, a pattern is produced by applying a photoresist to the surface of the gate stack to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. In the embodiment depicted in FIG. 4, the stack of material layers for the first gate structure 50 is entirely removed from the second device region 30.

The first gate structure 50 may include at least one gate conductor 51 atop at least one gate dielectric 52. The at least one gate conductor 51 may include a metal gate electrode. The metal gate electrode may be any conductive metal including, but not limited to W, Ni, Ti, Mo, Ta, Cu, Pt, Ag, Au, Ru, Ir, Rh, and Re, and alloys that include at least one of the aforementioned conductive elemental metals. In other embodiments, the at least one gate conductor 51 may include a doped semiconductor material, such as a doped silicon containing material, e.g., doped polysilicon. When a combination of conductive elements is employed in the at least one gate conductor 51, an optional diffusion barrier material, such as TaN or WN, may be formed between the conductive materials.

The at least one gate dielectric 52 may be a dielectric material, such as SiO$_2$, or alternatively high-k dielectrics, such as oxides of Hf, Ta, Zr, Al or combinations thereof. In another embodiment, the at least one gate dielectric 52 is comprised of an oxide, such as SiO$_2$, ZrO$_2$, Ta$_2$O$_5$ or Al$_2$O$_3$. In one embodiment, the gate dielectric 52 has a thickness ranging from 1 nm to 10 nm. In another embodiment, the gate dielectric 52 has a thickness ranging from 1.5 nm to 2.5 nm. In some embodiments, a gate dielectric cap (not shown) may be present atop the at least one gate conductor 51. The at least one gate dielectric cap may be composed of an oxide or nitride material.

A gate sidewall spacer 53 can be formed in direct contact with the sidewalls of the first gate structure 50. The gate sidewall spacer 53 may have a width ranging from 2.0 nm to 15.0 nm. The gate sidewall spacer 53 can be formed using deposition and etch processing steps. The gate sidewall spacer 53 may be composed of a dielectric, such as nitride, oxide, oxynitride, or a combination thereof.

Following formation of the first gate structure 50, a first source region 71 and a first drain region 72 may be formed in the portion of the SOI layer 20a, e.g., ETSOI layer, that is present in the first device region 25 of the SOI substrate 5. The first source region 71 and the first drain region 72 may be formed by ion implanting an n-type or p-type dopant into the SOI layer 20a, e.g., ETSOI layer. The second device region 30 of the SOI substrate 5 may be protected from being doped with the dopant for the first source region 71 and the first drain region 72 by a photoresist block mask that is formed over the second device region 30. The first source region 71 and the first drain region 72 may be doped to an n-type conductivity, when the first semiconductor device 100 is an n-type conductivity device, such as an n-type UTBB low voltage FET. The first source region 71 and the first drain region 72 may be doped to an p-type conductivity, when the first semiconductor device 100 is a p-type conductivity device, such as a p-type UTBB low voltage FET. The dopant concentration for the n-type or p-type dopant of the first source region 71 and the first drain region 72 may range from $5 \times 10^{19}$ atoms/cm$^3$ to $10^{21}$ atoms/cm$^3$. In another example, the dopant concentration for the n-type or p-type dopant of the first source region 71 and the first drain region 72 may range from $2 \times 10^{20}$ atoms/cm$^3$ to $7 \times 10^{20}$ atoms/cm$^3$.

Still referring to FIG. 4, an epitaxial semiconductor layer 60a, 60b, 60c is deposited on the exposed semiconductor surfaces of the SOI substrate 5. A first and second portion of the epitaxial semiconductor layer 60a, 60b are formed on the first source and drain regions 71, 72 to provide raised source and drain regions for the first semiconductor device 100. As used herein, the term "raised" in combination with source and/or drain denotes that the source and/or drain region is formed on a semiconductor material layer that is present on an upper surface of the SOI substrate on which the gate dielectric 52 for the first semiconductor device 100 is present. A third portion of the epitaxial semiconductor layer 60c is formed on the portion of the SOI layer 20b, e.g., ETSOI layer, that is present in the second device region 30 of the SOI substrate 5 to provide at least a portion of the gate conductor for the gate structure 70 (also referred to as second gate structure) to the second semiconductor device 200.

The first, second and third portions of the epitaxial semiconductor layer 60a, 60b, 60c are simultaneously formed using an epitaxial deposition process. The terms "epitaxial growth and/or deposition" and "epitaxially formed" mean the growth of a semiconductor material on a deposition surface of a semiconductor material, in which the semiconductor material being grown has the same crystalline characteristics as the semiconductor material of the deposition surface. When the chemical reactants are controlled and the system parameters set correctly, the depositing atoms arrive at the surface of the ETSOI layer 20 with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, possibly the result of implanting, the depositing atoms have no surface to align to, resulting in the formation of polysilicon instead of single crystal silicon. The epitaxial semiconductor layer 60a, 60b, 60c may be composed of a silicon containing material, such as silicon (Si), silicon germanium (SiGe), silicon doped with carbon (Si:C) and combinations thereof. A number of different sources may be used for the deposition of epitaxial silicon. Silicon sources for epitaxial growth include silicon tetrachloride, dichlorosilane ($SiH_2Cl_2$), and silane ($SiH_4$). The temperature for epitaxial silicon deposition typically ranges from 550° C. to 900° C. Although higher temperature typically results in faster deposition, the faster deposition may result in crystal defects and film cracking.

The epitaxial semiconductor layer 60a, 60b, 60c may be in situ doped with a p-type or n-type dopant. By "in-situ" it is meant that the dopant that dictates the conductivity type of the epitaxial semiconductor layer 60a, 60b, 60c is introduced during the process step, e.g., epitaxial deposition, which forms the epitaxial semiconductor layer 60a, 60b, 60c. One example of a dopant gas source for producing an n-type conductivity material with an epitaxial deposition process is phosphine, and one example of a dopant gas source for producing an p-type conductivity material with an epitaxial deposition process is diborane.

The epitaxial semiconductor layer 60a, 60b, 60c is typically formed in the deposition chamber of a chemical vapor deposition (CVD) apparatus. Examples of CVD apparatus that are suitable for the epitaxial semiconductor layer 60a, 60b, 60c include plasma enhanced chemical vapor deposition (PECVD), metal organic chemical vapor deposition (MOCVD), high density plasma chemical vapor deposition (HDPCVD), and combinations thereof.

Typically, the conductivity type of the first and second portion of the epitaxial semiconductor layer 60a, 60b that is formed on the first source region 71 and the first drain region 72 has the same conductivity type as the first source region 71 and the first drain region 72. For example, when the first source region 71 and the first drain region 72 are doped to an n-type conductivity, the first and second portion of the epitaxial semiconductor layer 60a, 60b has an n-type conductivity; and when the first source region 71 and the first drain region 72 are doped to a p-type conductivity, the first and second portion of the epitaxial semiconductor layer 60a, 60b has a p-type conductivity. The first, second and third portions of the epitaxial semiconductor layer 60a, 60b, 60c are formed simultaneously. Therefore, the third portion of the epitaxial semiconductor layer 60c is in situ doped to the same conductivity as the first and second portions of the epitaxial semiconductor layer 60a, 60b.

The term "simultaneously formed" to describe the formation of the first, second and third portions of the epitaxial semiconductor layer 60a, 60b, 60c means that the first, second and third portions of the epitaxial semiconductor layer 60a, 60b, 60c are formed using the same epitaxial deposition step, i.e., single epitaxial deposition, for the first, second and third portions of the epitaxial semiconductor layer 60a, 60b, 60c. For example, because the first, second and third portions of the epitaxial semiconductor layer 60a, 60b, 60c are formed using the same epitaxial deposition, the thickness, conductivity type and concentration of dopant that dictates the conductivity type will be the same for each of the first, second and third portions of the epitaxial semiconductor layer 60a, 60b, 60c. This is distinguishable from using a separate epitaxial deposition for each portion of the epitaxial semiconductor layer 60a, 60b, 60c, because using a separate epitaxial deposition step for each of the portion of the epitaxial semiconductor layer 60a, 60b, 60c would result in higher fabrication cost.

In one embodiment, the thickness T1 for each of the first, second and third portions of the epitaxial semiconductor layer 60a, 60b, 60c may range from 10 nm to 50 nm. In another embodiment, the thickness T1 for each of the first, second and third portions of the epitaxial semiconductor layer 60a, 60b, 60c may range from 15 nm to 30 nm. The dopant concentration for each of the first, second and third portions of the epitaxial semiconductor layer 60a, 60b, 60c may range from $10^{20}$ atoms/cm$^3$ to $10^{21}$ atoms/cm$^3$. In another example, the dopant concentration for each of the first, second and third portions of the epitaxial semiconductor layer 60a, 60b, 60c may range from $2 \times 10^{20}$ atoms/cm$^3$ to $7 \times 10^{20}$ atoms/cm$^3$.

The epitaxial deposition process for forming the first, second and third portions of the epitaxial semiconductor layer 60a, 60b, 60c is a selective deposition process. For example, the epitaxial semiconductor material that provides the first, second and third portions of the epitaxial semiconductor layer 60a, 60b, 60c is epitaxially formed only on semiconductor material surfaces, such as the SOI layer 20a, 20b, and will not be formed on dielectric surfaces, such as the upper surface of the isolation regions 21, 22 and the gate sidewall spacers 53. In other embodiments, the epitaxial material that is epitaxially deposited on the SOI layer 20a, 20b to provide the first, second and third portions of the epitaxial semiconductor layer 60a, 60b, 60c, is crystalline, e.g., monocrystalline or polycrystalline, whereas any material deposited during the epitaxial process for the epitaxial semiconductor layer on dielectric surfaces, such as the isolation regions 21, 22 and the gate sidewall spacer 53, is amorphous. The amorphous material may be removed selectively to the crystalline material using a selective etch.

Figure 5:
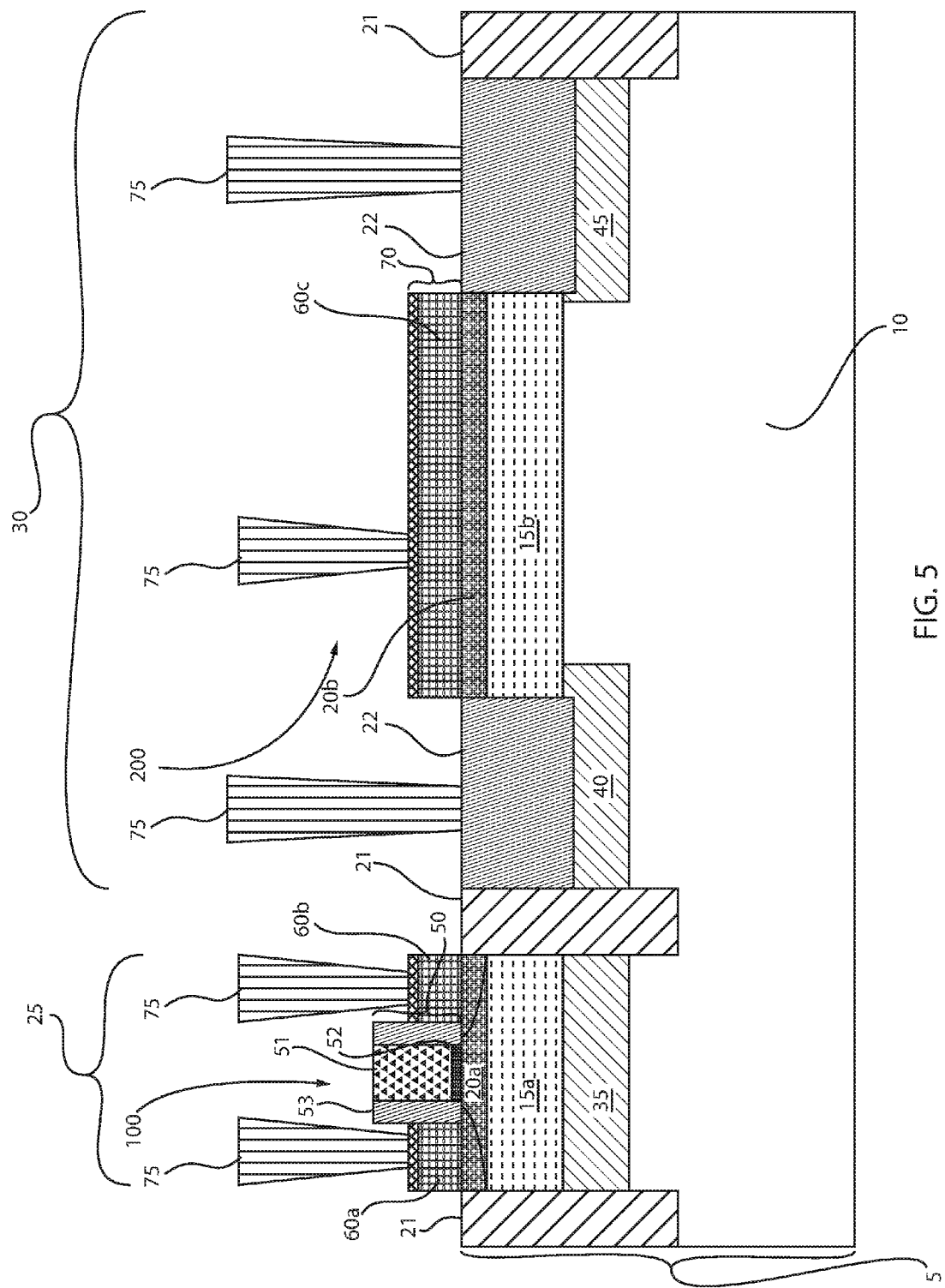
FIG. 5 is a side cross-sectional view depicting one embodiment of forming contacts to the first and second semiconductor devices, in accordance with one embodiment of the present disclosure.

FIG. 5 depicts one embodiment of forming contacts 75 to the first and second semiconductor devices 100, 200. In one embodiment, prior to forming the contacts 75, silicides 74 are formed on the upper surface of the third portion of the epitaxial semiconductor layer 60c that provides the gate conductor to the gate structure of the second semiconductor device 200, and on the upper surface of the first and second portions of the epitaxial semiconductor layer 60a, 60b that provide the raised source and drain regions to the first semiconductor device 100. Silicide formation typically requires depositing a refractory metal such as cobalt, nickel, or titanium onto the surface of a Si-containing material. Following deposition, the structure is subjected to an annealing step using thermal processes such as, but not limited to, rapid thermal annealing. During thermal annealing, the deposited metal reacts with silicon forming a metal silicide. The remaining unreacted metal is removed by an etch process selective to silicides 74.

Following silicide 74 formation, a layer of dielectric material (not shown) can be blanket deposited atop the entire substrate and planarized. The blanket dielectric may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the blanket dielectric include any of the aforementioned materials in porous form, or in a form that changes during processing to or from being porous and/or permeable to being non-porous and/or non-permeable.

The deposited dielectric is then patterned and etched to form via holes to the various source/drain and gate conductor regions of the device. In some embodiments, an opening may be formed through the shallow trench isolation regions 22 to expose the second and third well regions 40, 45 that provide the source and drain regions for the second semiconductor device 200.

Following via formation, interconnects 75 are formed by depositing a conductive metal into the via holes using deposition methods, such as CVD or plating. The conductive metal may include, but is not limited to: tungsten, copper, aluminum, silver, gold and alloys thereof.

FIG. 5 depicts one embodiment of an electrical device including a semiconductor on insulator (SOI) substrate 5, a first semiconductor device 100 in a first device region 25 of the SOI substrate 5, and a second semiconductor device 200 in a second device region 30 of the SOI substrate 5. The first semiconductor device 100 includes a first source region 71 and a first drain region 72 that is present in the SOI layer 20a of the SOI substrate 5 in the first device region 25 of the SOI substrate 5. The first semiconductor device 100 further includes raised source and drain regions (first and second portion of the epitaxial semiconductor layer 60a, 60b) on the first source region 71 and the first drain region 72. A first gate structure 50 is present on a channel region portion of the SOI layer 20a in the first device region 25. The second semiconductor device 200 includes a second source region (second well region 40) and a second drain region (third well region 45) present in a base semiconductor layer 10 of the SOI substrate 5. The second semiconductor device 200 also includes a second gate structure 70, wherein a gate dielectric of the second gate structure 70 is provided by a buried dielectric layer 15b of the SOI substrate 5 between the SOI layer 20b and the base semiconductor substrate 10. A gate conductor of the second gate structure 70 comprises a same material as the raised source region and the raised drain region, which is provided by a third portion of the epitaxial semiconductor layer 60c.

Figure 6:
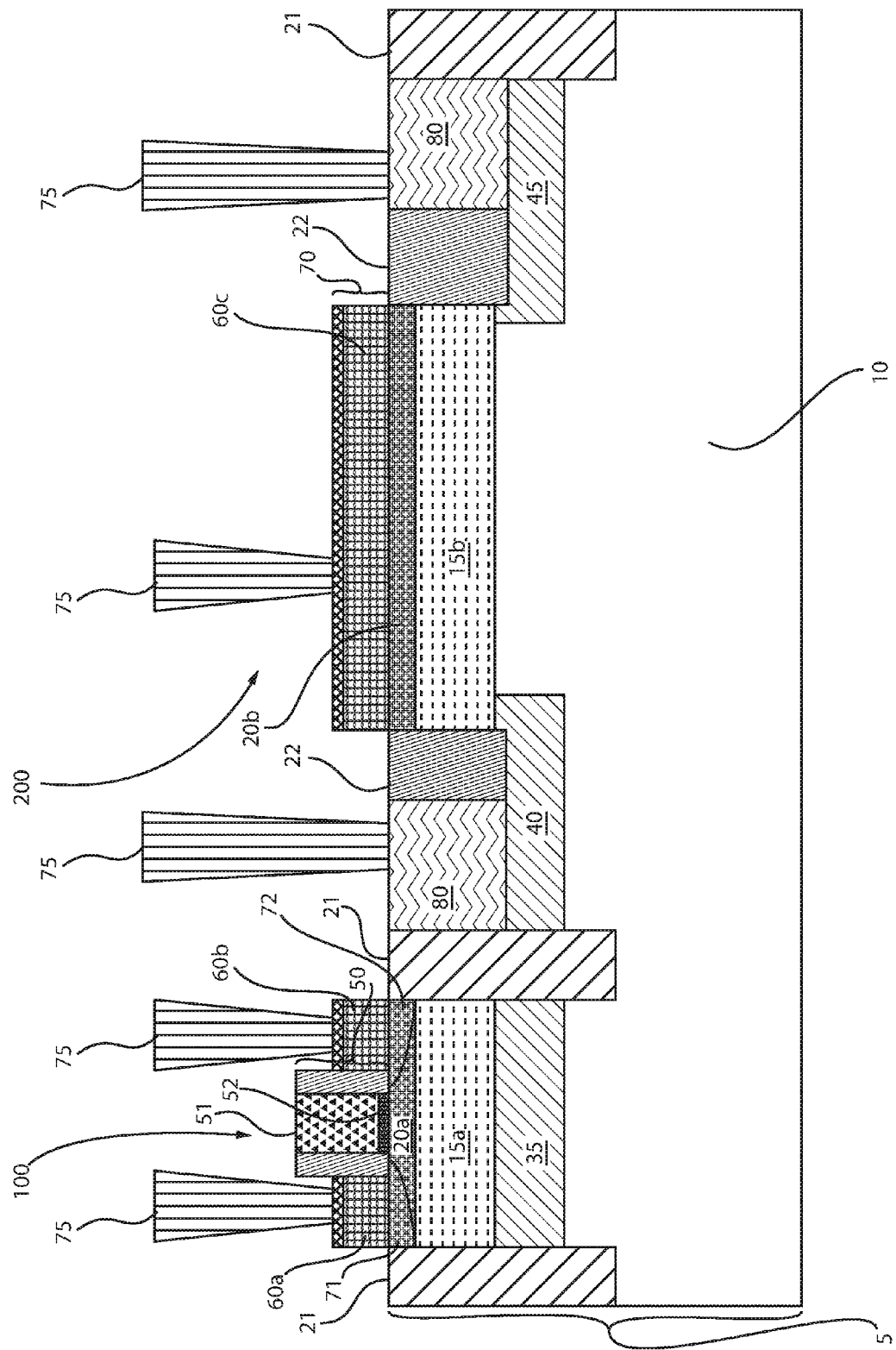
FIG. 6 is a side cross-sectional view of another embodiment of the present disclosure in which an epitaxial semiconductor material is present between the source and drain regions of the second semiconductor device and the contacts bringing electrical communication to the source and drain regions of the second semiconductor device, in accordance with the present disclosure.

FIG. 6 depicts another embodiment in which an epitaxial semiconductor material 80 is present between the source and drain regions (second and third well regions 40, 45) of the second semiconductor device 200 and the contacts 75 bringing electrical communication to the source and drain regions of the second semiconductor device 200. The epitaxial semiconductor material 80 may extend through the shallow trench isolation regions 22. The epitaxial semiconductor material 80 may be composed of any semiconductor material, e.g., silicon, and may be doped to an n-type or p-type dopant.

Figure 7:
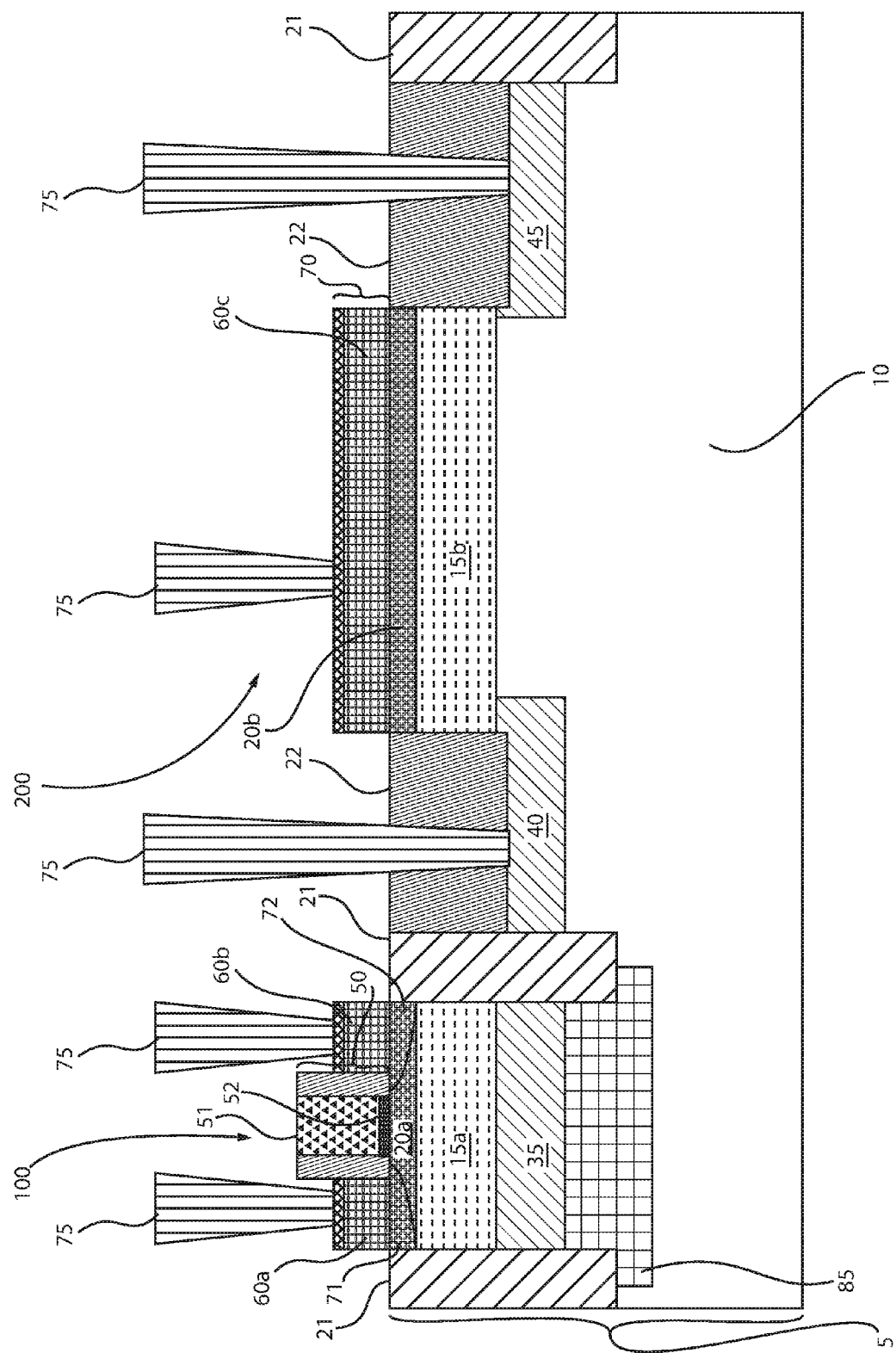
FIG. 7 is a side cross-sectional view of yet another embodiment of the present disclosure in which a punch through stopper implant is present underlying a back gate structure to the first semiconductor device.

FIG. 7 depicts another embodiment of the present disclosure in which a punch through stopper implant region 85 is present underlying a back gate structure to the first semiconductor device 100, wherein the back gate structure is provided by the first well region 30. The punch through stopper implant region 85 is typically formed using ion implantation. The punch through stopper implant region 85 has a conductivity type that is opposite the conductivity type as the back gate structure. For example, if the back gate structure has an n-type conductivity, the punch through stopper implant region 85 may have a p-type conductivity. In another example, if the back gate structure has a p-type conductivity, the punch through stopper implant region 85 may have an n-type conductivity.

Figure 8:
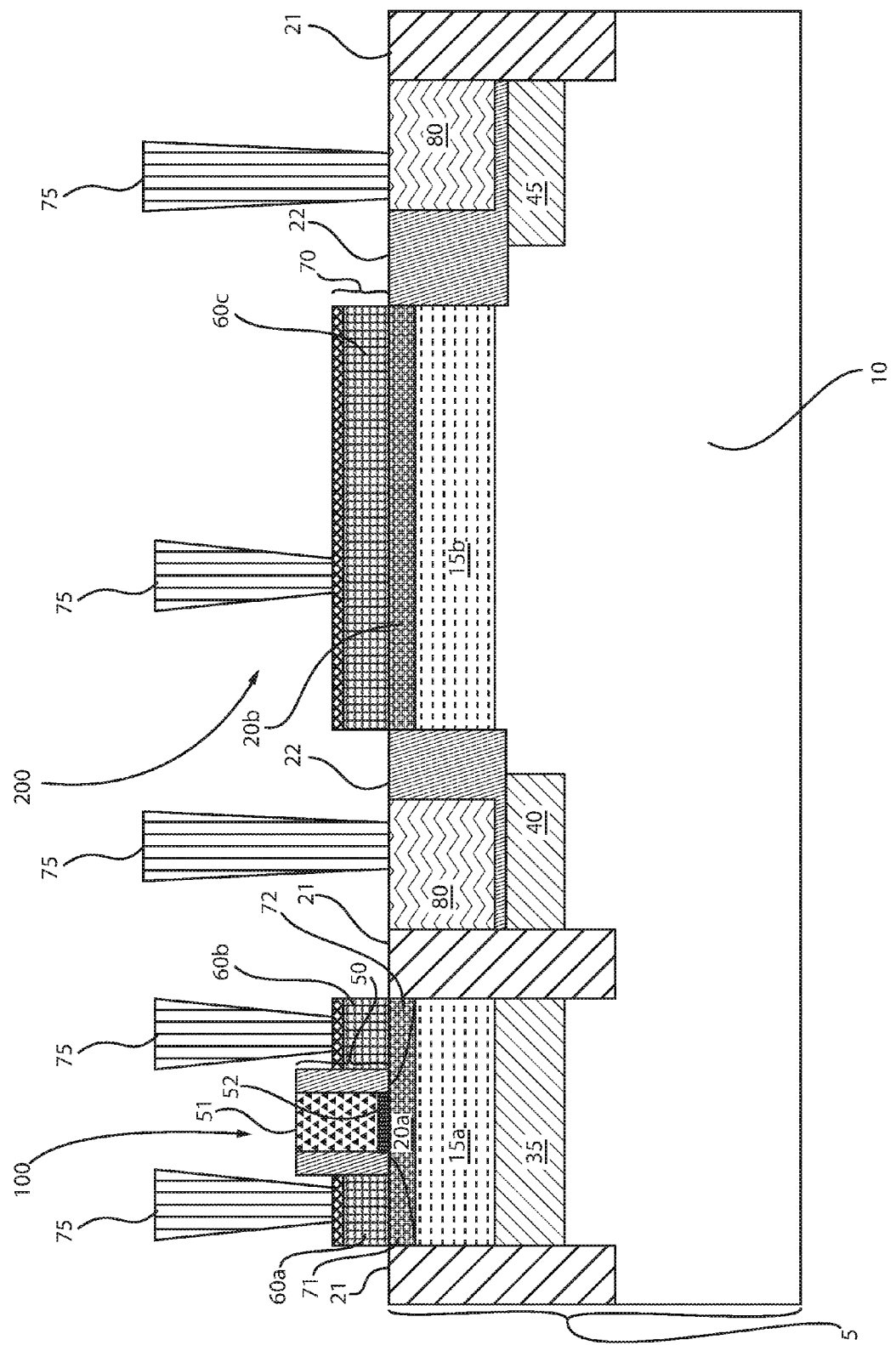
FIG. 8 is a side cross-sectional view of a further embodiment of the present disclosure, in which the source and drain regions to the second semiconductor device are offset from the sidewalls of the gate structure to the second semiconductor device.

FIG. 8 depicts a further embodiment of the present disclosure, in which the source and drain regions to the second semiconductor device are offset from the sidewalls of the gate structure to the second semiconductor device. This is achieved by designing the lithography mask that defines the region that are ion implanted to formed the second and third well regions 40 and 45 to be offset with respects to the shallow trench isolations 22 that define the channel region of the second semiconductor device 200.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor device comprising:

forming a first semiconductor device in the a first device region of a semiconductor on insulator (SOI) substrate, wherein the first semiconductor device includes a first source region and a first drain region that is formed in the SOI layer, raised source and drain regions on the first source and drain regions, and a first gate structure on a channel region portion of the SOI layer; and forming a second semiconductor device in the second device region of the SOI substrate, wherein the second device includes a second source region and a second drain region that is present in a base semiconductor substrate of the SOI substrate, and a second gate structure including a gate dielectric provided by a buried dielectric layer of the SOI substrate and a gate conductor comprised of a same material as the raised source and drain regions.

2. The method of claim 1, wherein the second source region and the second drain region are formed in the base semiconductor substrate by ion implantation of an n-type or p-type dopant, wherein the ion implantation of the n-type or p-type dopant in the second device region to form the second source region and the second drain region simultaneously forms a back gate structure in the first device region.

3. The method of claim 1, wherein the first gate structure is formed by a process comprising:
depositing a gate stack of a first gate dielectric layer and a first conductor layer; and
patterning and etching the gate stack so that a remaining portion provides the first gate structure in the first device region.

4. The method of claim 3 further comprising forming a gate sidewall spacer on the sidewall of the first gate structure.

5. The method of claim 1, wherein the raised source and drain regions are formed using an epitaxial deposition process that simultaneously forms an epitaxial material portion of the gate conductor for the second gate structure.

6. The method of claim 2 further comprising forming a punch through stop region in the first device region of the base semiconductor substrate, wherein the punch through stop region is present underlying the back gate structure.

7. An electrical device comprising:
a semiconductor on insulator (SOI) substrate;
a first semiconductor device in a first device region of the SOI substrate, the first semiconductor device comprising a first source region and a first drain region that is present in the SOI layer of the SOI substrate in the first device region of the SOI substrate, raised source and drain regions on the first source region and the first drain region; and
a second semiconductor device in a second device region of the SOI substrate, the second semiconductor device comprises a second source region and a second drain region present in a base semiconductor layer of the SOI substrate and a second gate structure, wherein a gate dielectric of the second gate structure is provided by a buried dielectric layer of the SOI substrate between the SOI layer and the base semiconductor substrate and a gate conductor of the second gate structure comprises a same material as the raised source region and the raised drain region.

8. The electrical device of claim 7, wherein the SOI layer has a thickness of 10 nm to less.

9. The electrical device of claim 7, wherein the buried dielectric layer of the SOI substrate has a thickness ranging from 10 nm to 30 nm.

10. The electrical device of claim 7, wherein the first semiconductor device includes a first gate structure, wherein the first gate dielectric layer of the first gate structure has a thickness of 1 nm to 5 nm.

11. The electrical device of claim 7, wherein the first device region is separated from the second device region by a trench isolation region extending through the SOI layer, the buried dielectric layer and extending into the base semiconductor layer of the SOI substrate.

12. The electrical device of claim 11, wherein a back gate structure is present underlying the first semiconductor device, the back gate structure having a same conductivity type and present at a same depth within the base semiconductor layer as the second source region and the second drain region.

13. The electrical device of claim 11, wherein an edge of the second source region and the second drain region is aligned with a sidewall of the second gate structure.

14. The electrical device of claim 11, wherein an edge of the second source region and the second drain region is offset from a sidewall of the second gate structure.

15. An electrical device comprises:
a semiconductor on insulator (SOI) substrate;
a first semiconductor device in a first region of the SOI substrate, the first semiconductor device comprising a first source region and a first drain region that is present in the SOI layer of the SOI substrate in the first region of the SOI substrate, raised source and drain regions on the first source region and the first drain region; and
a second semiconductor device in a second region of the SOI substrate, the second semiconductor device comprises a second source region and a second drain region present in a base semiconductor layer of the SOI substrate and a second gate structure, wherein a gate dielectric of the second gate structure is provided by a buried dielectric layer of the SOI substrate between the SOI layer and the base semiconductor substrate and a gate conductor of the second gate structure comprises a same material as the raised source region and the raised drain region.

16. The electrical device of claim 15, wherein the SOI layer has a thickness of 10 nm to less.

17. The electrical device of claim 16, wherein the buried dielectric layer of the SOI substrate has a thickness ranging from 10 nm to 30 nm.

18. The electrical device of claim 16, wherein the first semiconductor device includes a first gate structure.

19. The electrical device of claim 18, wherein the first gate dielectric layer of the first gate structure has a thickness of 1 nm to 5 nm.

* * * * *